US012224720B2

United States Patent
Tai et al.

(10) Patent No.: US 12,224,720 B2
(45) Date of Patent: Feb. 11, 2025

(54) RADIO FREQUENCY AMPLIFIER AND BIAS CIRCUIT

(71) Applicant: RichWave Technology Corp., Taipei (TW)

(72) Inventors: Shun-Nan Tai, Taipei (TW); Yao Hui Chiang, Taipei (TW)

(73) Assignee: RichWave Technology Corp., Taipei (TW)

( * ) Notice: Subject to any disclaimer, the term of this patent is extended or adjusted under 35 U.S.C. 154(b) by 591 days.

(21) Appl. No.: 17/474,055

(22) Filed: Sep. 14, 2021

(65) Prior Publication Data

US 2022/0385245 A1 Dec. 1, 2022

(30) Foreign Application Priority Data

May 25, 2021 (TW) ................................. 110118870

(51) Int. Cl.
*H03F 3/19* (2006.01)
*H03F 1/56* (2006.01)

(52) U.S. Cl.
CPC .............. *H03F 3/19* (2013.01); *H03F 1/565* (2013.01); *H03F 2200/222* (2013.01); *H03F 2200/387* (2013.01); *H03F 2200/451* (2013.01)

(58) Field of Classification Search
CPC ...... H03F 3/19; H03F 1/565; H03F 2200/222; H03F 2200/387; H03F 2200/451; H03F 2200/225; H03F 2200/246; H03F 1/30; H03F 3/191; H03F 2200/24
USPC ......................................... 330/296, 285, 302
See application file for complete search history.

(56) References Cited

U.S. PATENT DOCUMENTS

| 5,111,065 A | 5/1992 | Roberge |
| 6,657,498 B2 | 12/2003 | Park et al. |
| 6,882,227 B2 * | 4/2005 | Barry .................... H03F 1/0261 330/296 |

(Continued)

FOREIGN PATENT DOCUMENTS

| CN | 101119100 | 2/2008 |
| TW | 252390 | 4/2006 |

(Continued)

OTHER PUBLICATIONS

"Office Action of Taiwan Counterpart Application", issued on Feb. 17, 2022, p. 1-p. 5.

*Primary Examiner* — Hieu P Nguyen
(74) *Attorney, Agent, or Firm* — JCIPRNET

(57) ABSTRACT

A radio frequency (RF) amplifier and a bias circuit are provided. The RF amplifier includes an amplifier, a first inductive-capacitive resonance circuit, and a first bias circuit. The amplifier includes an input terminal configured to receive an incoming RF signal through a first RF path. The first inductive-capacitive resonance circuit includes a first terminal coupled to a first reference voltage. A second terminal of the first inductive-capacitive resonance circuit is coupled to the first RF path. In response to the first reference voltage being at a first reference level, the RF amplifier is enabled; in response to the first reference voltage being at a second reference level, the RF amplifier is disabled. The first bias circuit includes a first terminal configured to be coupled to the first reference voltage and a second terminal coupled to the input terminal of the amplifier to provide a first direct current (DC) component.

20 Claims, 8 Drawing Sheets

(56) References Cited

U.S. PATENT DOCUMENTS

| | | | |
|---|---|---|---|
| 7,688,133 B2 * | 3/2010 | Yamamoto | H03F 1/0261 |
| | | | 330/296 |
| 2008/0169873 A1 | 7/2008 | Toda | |
| 2015/0097620 A1 | 4/2015 | Adamski | |
| 2019/0356283 A1 | 11/2019 | Chen et al. | |
| 2020/0007088 A1 | 1/2020 | Ranta et al. | |
| 2020/0014417 A1 | 1/2020 | Burgener et al. | |
| 2020/0395898 A1 | 12/2020 | Wang | |
| 2021/0058041 A1 | 2/2021 | Nobbe et al. | |

FOREIGN PATENT DOCUMENTS

| | | |
|---|---|---|
| TW | 201546798 | 12/2015 |
| TW | I710209 | 11/2020 |

\* cited by examiner

RADIO FREQUENCY AMPLIFIER AND BIAS CIRCUIT

CROSS-REFERENCE TO RELATED APPLICATION

This application claims the priority benefit of Taiwan application serial no. 110118870, filed on May 25, 2021. The entirety of the above-mentioned patent application is hereby incorporated by reference herein and made a part of this specification.

BACKGROUND

Technical Field

The disclosure relates to an amplifier, and particularly relates to a radio frequency (RF) amplifier and its bias circuit.

Description of Related Art

Radio Frequency (RF) amplifiers are widely used in a variety of fields, such as televisions, radios, mobile phones, radars, automatic identification systems, etc. Usually in order to suppress some noise and prevent signal interference with frequencies adjacent to the fundamental tone, an inductor and capacitor are used to form a filter path. Generally, at the initial stage of enabling the RF amplifier, a direct current (DC) bias of a transistor of the amplifier is pulled up to a certain target level, so as to allow the RF amplifier to enter an operation point. Therefore, after the RF amplifier is enabled, the RF amplifier can start to operate as usual only after a period of waiting time (configuration time). How to shorten such waiting time is one of the technical issues to be resolved.

SUMMARY

The disclosure provides a radio frequency (RF) amplifier and a bias circuit which may allow the RF amplifier to reach the operation point rapidly.

In an embodiment of the disclosure, an RF amplifier includes an amplifier, a first inductive-capacitive resonance circuit, and a first bias circuit. The amplifier includes an input terminal configured to receive an incoming radio frequency signal through a first RF path. The first inductive-capacitive resonance circuit includes a first terminal configured to be coupled to a first reference voltage. A second terminal of the first inductive-capacitive resonance circuit is coupled to the first RF path. In response to the first reference voltage being at a first reference level, the RF amplifier is enabled. In response to the first reference voltage being at a second reference level, the RF amplifier is disabled. The first bias circuit includes a first terminal configured to be coupled to the first reference voltage. A second terminal of the first bias circuit is coupled to the input terminal of the amplifier to provide a first direct current (DC) component.

In an embodiment of the disclosure, the bias circuit includes a first resistor, a first transistor, a second transistor, and a third transistor. A first terminal of the first resistor is coupled to a system voltage. A first terminal of the first transistor is coupled to a second terminal of the first resistor. A second terminal of the first transistor is coupled to an output terminal of the bias circuit. A first terminal of the second transistor is coupled to the system voltage. A control terminal of the second transistor is coupled to a second terminal of the first resistor. A first terminal of the third transistor is coupled to the second terminal of the first transistor. A second terminal of the third transistor is coupled to a reference voltage. A control terminal of the third transistor is coupled to a second terminal of the second transistor.

In order to make the above features of the disclosure comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF THE EMBODIMENTS

Figure 1:
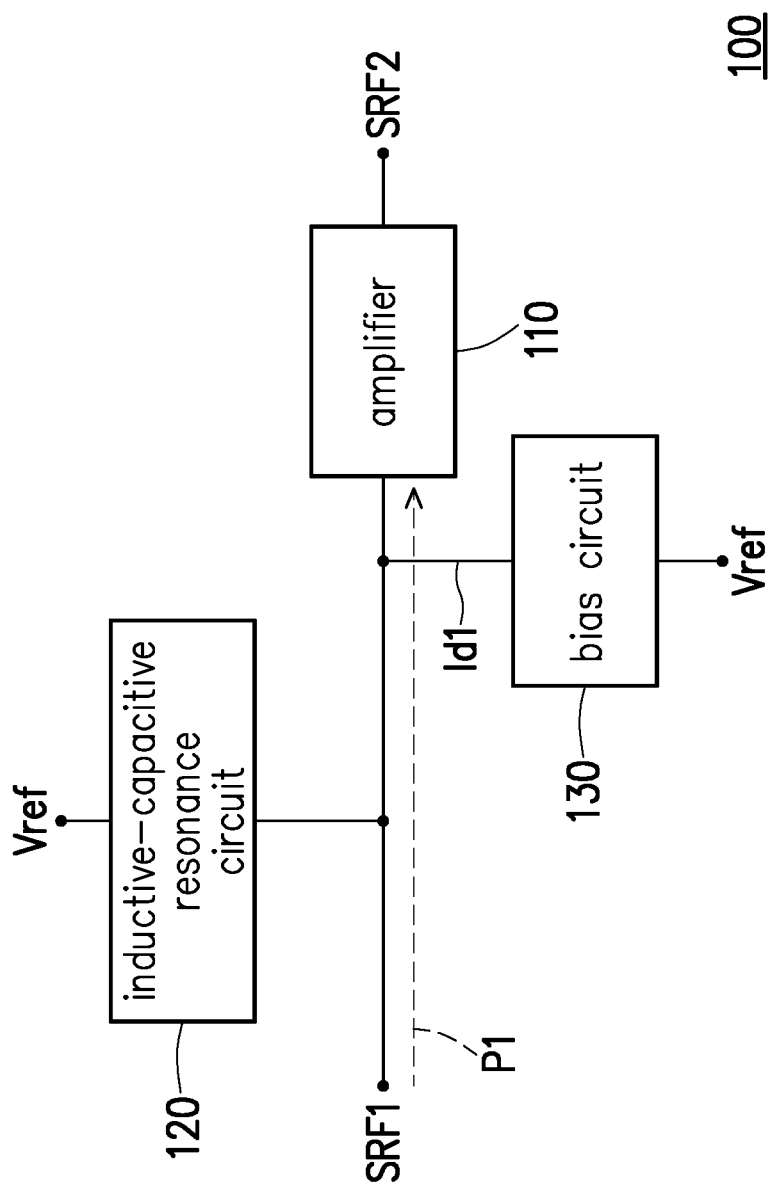
FIG. 1 is a schematic circuit block diagram of a radio frequency (RF) amplifier according to an embodiment of the disclosure.

The term "coupling (or connection)" used in the full text of the specification of the disclosure (including the claims) may refer to any direct or indirect means of connection. For example, if the text describes that a first apparatus is coupled (or connected) to a second apparatus, it should be interpreted as that the first apparatus may be directly connected to the second apparatus, or the first apparatus may be indirectly connected to the second apparatus through other apparatuses or some kind of connection means. The terms "first" and "second" mentioned in the entire specification of the disclosure (including claims) are used to name the elements, or to distinguish between different embodiments or ranges, and are not used to limit the upper or lower limit of the number of elements, nor are they used to limit the order of the components. In addition, wherever possible, elements/components/steps using the same reference numbers in the drawings and embodiments represent the same or similar elements/components/steps. Elements/components/steps that use the same reference numerals or use the same terms in different embodiments may be cross-referenced for relevant descriptions.

FIG. 1 is a schematic circuit block diagram of a radio frequency (RF) amplifier 100 according to an embodiment of the disclosure. In the embodiment shown in FIG. 1, the RF amplifier 100 includes an amplifier 110, an inductive-capacitive resonance circuit 120, and a bias circuit 130, all of which are coupled to an RF path P1. In the embodiment, the amplifier 110 includes an input terminal and an output terminal. The input terminal is configured to receive an incoming RF signal SRF1 through the RF path P1, and the output terminal is configured to output an amplified RF signal SRF2. The bias circuit 130 includes a first terminal and a second terminal, the first terminal is configured to be coupled to a reference voltage Vref, and the second terminal is configured to be coupled to the input terminal of the amplifier 110 to provide a direct current (DC) component Id1. The reference voltage Vref may be provided by a control circuit or externally, and may be switched between different reference levels to enable and disable the RF amplifier 100. In response to the reference voltage Vref being at a first reference level (e.g., a high reference level), the RF amplifier 100 is enabled for normal operation. At this time, the DC component Id1 provided by the bias circuit 130 allows the amplifier 110 to operate in a linear region, and the amplifier 110 may amplify the incoming RF signal SRF1 of the RF path P1 to output the amplified RF signal SRF2. In response to the reference voltage Vref being at a second reference level (different from the first reference level, e.g., a low reference level), the RF amplifier 100 is disabled. At this time, the bias circuit 130 cancels (i.e., does not provide) or reduces the DC component Id1.

A first terminal of the inductive-capacitive resonance circuit 120 is coupled to the reference voltage Vref. A second terminal of the inductive-capacitive resonance circuit 120 is coupled to the RF path P1. In some embodiments, the incoming RF signal SRF1 may include two fundamental tones at a first frequency and a second frequency. When the RF amplifier 100 is enabled (in normal operation), the inductive-capacitive resonance circuit 120 may provide a filter path to perform a filtering operation on signal components of the incoming RF signal SRF1 outside the frequency band constituted by the first frequency and the second frequency. For instance, the filter path may perform a filtering operation on a frequency related to the difference between the first frequency and the second frequency. Furthermore, the filter path provided by the inductive-capacitive resonance circuit 120 is a low impedance path for a signal having a frequency related to the difference between the first frequency and the second frequency, and the filter path provided by the inductive-capacitive resonance circuit 120 is a high impedance path for a signal with a frequency band within the first frequency and the second frequency. Therefore, the signal having the frequency related to the difference between the first frequency and the second frequency may be guided to the reference voltage Vref through the filter path provided by the inductive-capacitive resonance circuit 120 to achieve a filtering effect.

In the initial stage during which the RF amplifier 100 is changed from the disabled state to the enabled state, the bias circuit 130 requires a period of waiting time to pull up a DC level of the amplifier 110 from low (e.g., the ground level) to a preset target level, so as to allow the RF amplifier 100 to enter an operation point. When the reference voltage Vref is switched from the second reference level to the first reference level to enable the bias circuit 130, the inductive-capacitive resonance circuit 120 may correspondingly increase a voltage of the RF path P1 according to variations of the reference voltage Vref, so that the bias circuit 130 may quickly pull up the DC level of the amplifier 110 from low (e.g., the ground level) to the preset target level. As such, the inductive-capacitive resonance circuit 120 is able to shorten the time of configuring the DC level of the amplifier 110, so as to allow the amplifier 110 to reach the operation point more quickly.

Figure 2:
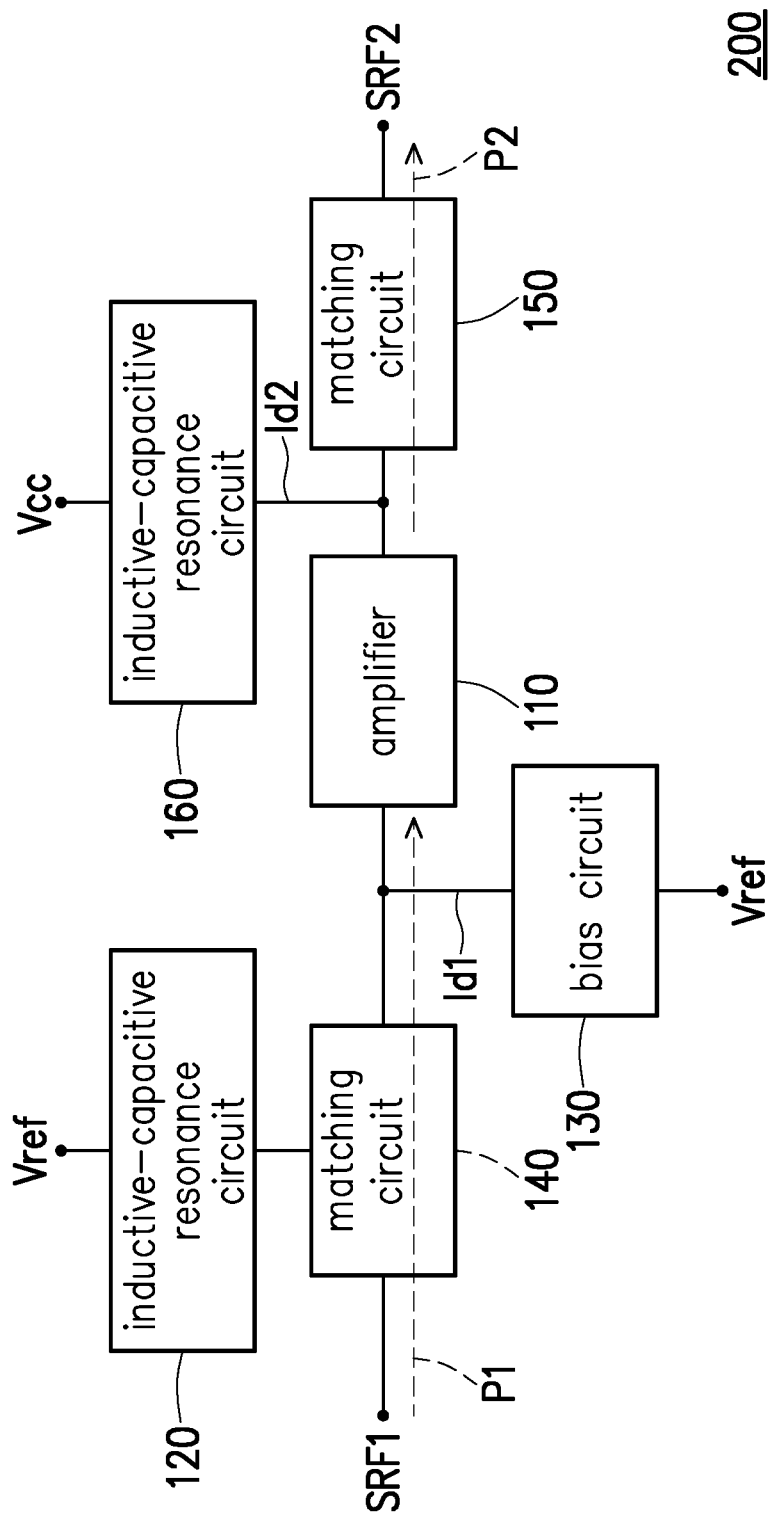
FIG. 2 is a schematic circuit block diagram of an RF amplifier according to another embodiment of the disclosure.

FIG. 2 is a schematic circuit block diagram of an RF amplifier 200 according to another embodiment of the disclosure. In the embodiment shown in FIG. 2, the RF amplifier 200 may include the amplifier 110, the inductive-capacitive resonance circuit 120, and the bias circuit 130. The descriptions of the amplifier 110, the inductive-capacitive resonance circuit 120, and the bias circuit 130 shown in FIG. 2 may be deduced by analogy from the descriptions of the amplifier 110, the inductive-capacitive resonance circuit 120, and the bias circuit 130 shown in FIG. 1 and thus will not be repeated hereinafter. In the embodiment shown in FIG. 2, according to design requirements, the RF amplifier 200 may further include a matching circuit 140. The matching circuit 140 is arranged in the RF path P1. The matching circuit 140 may be coupled to the input terminal of the amplifier 110 through the RF path P1. On the RF path P1, the input terminal of the amplifier 110 may receive the incoming RF signal SRF1 through the matching circuit 140.

According to design requirements, the matching circuit 140 may include an inductor, and the inductive-capacitive resonance circuit 120 and the matching circuit 140 may share the inductor included in the matching circuit 140 to have a first resonance frequency. According to design requirements, the incoming RF signal SRF1 may include two fundamental tones at the first frequency and the second frequency, and the matching circuit 140 may provide an input impedance matching these two fundamental tones, i.e., the input impedance matching the amplifier 110. The inductive-capacitive resonance circuit 120 may provide a filter path to perform a filtering operation on signal components of the incoming RF signal SRF1 outside the frequency band constituted by the first frequency and the second frequency.

In the embodiment shown in FIG. 2, according to design requirements, the RF amplifier 200 may further include a matching circuit 150. The matching circuit 150 may be arranged in an RF path P2 shown in FIG. 2. The matching circuit 150 may be coupled to the output terminal of the amplifier 110. On the RF path P2, the output terminal of the amplifier 110 may output the amplified RF signal SRF2 through the matching circuit 150. Similar to the relevant descriptions of the matching circuit 140, the amplified RF signal SRF2 may include two fundamental tones at the first frequency and the second frequency, and the matching circuit 150 may provide an output impedance (Rout) matching these two fundamental tones, i.e., the Rout matching the amplifier 110.

In the embodiment, according to design requirements, the RF amplifier 200 may further include an inductive-capacitive resonance circuit 160. In some embodiments, a first terminal of the inductive-capacitive resonance circuit 160 may be coupled to another reference voltage (e.g., a relatively constant system voltage Vcc). The inductive-capacitive resonance circuit 160 may be coupled to the output terminal of the amplifier 110 to provide a DC component Id2, so that the amplifier 110 may operate in the linear region. Similar to the relevant descriptions of the inductive-capacitive resonance circuit 120, the inductive-capacitive resonance circuit 160 may provide a filter path to perform a filtering operation on signal components of the amplified RF signal SRF2 outside the frequency band constituted by the first frequency and the second frequency. The matching circuit 150 may include an inductor, and the inductive-capacitive resonance circuit 160 and the matching circuit 150 may share the inductor included in the matching circuit 150 to have a second resonance frequency. According to design requirements, the incoming RF signal SRF1 and/or the amplified RF signal SRF2 may include two fundamental tones at the first frequency and the second frequency. The inductive-capacitive resonance circuit 160 may provide a filter path to perform a filtering operation on signal components of the amplified RF signal SRF2 (output by the amplifier 110) outside the frequency band constituted by the first frequency and the second frequency. In other words, the filter path provided by the inductive-capacitive resonance circuit 160 is a low impedance path for a signal having a frequency related to the difference between the first frequency and the second frequency, and the filter path provided by the inductive-capacitive resonance circuit 160 is a high impedance path for a signal with a frequency band within the first frequency and the second frequency. Therefore, the signal having the frequency related to the difference between the first frequency and the second frequency may be guided to the system voltage Vcc through the filter path provided by the inductive-capacitive resonance circuit 160 to achieve a filtering effect.

As such, the filter path provided by the inductive-capacitive resonance circuits 120 and 160 may filter out signal components other than the frequency band formed by the first frequency and the second frequency. Therefore, the RF amplifier 200 may effectively suppress the noise associated with the two fundamental tones of the incoming RF signal SRF1 and increase linearity of output power of the RF amplifier 200.

Figure 3:
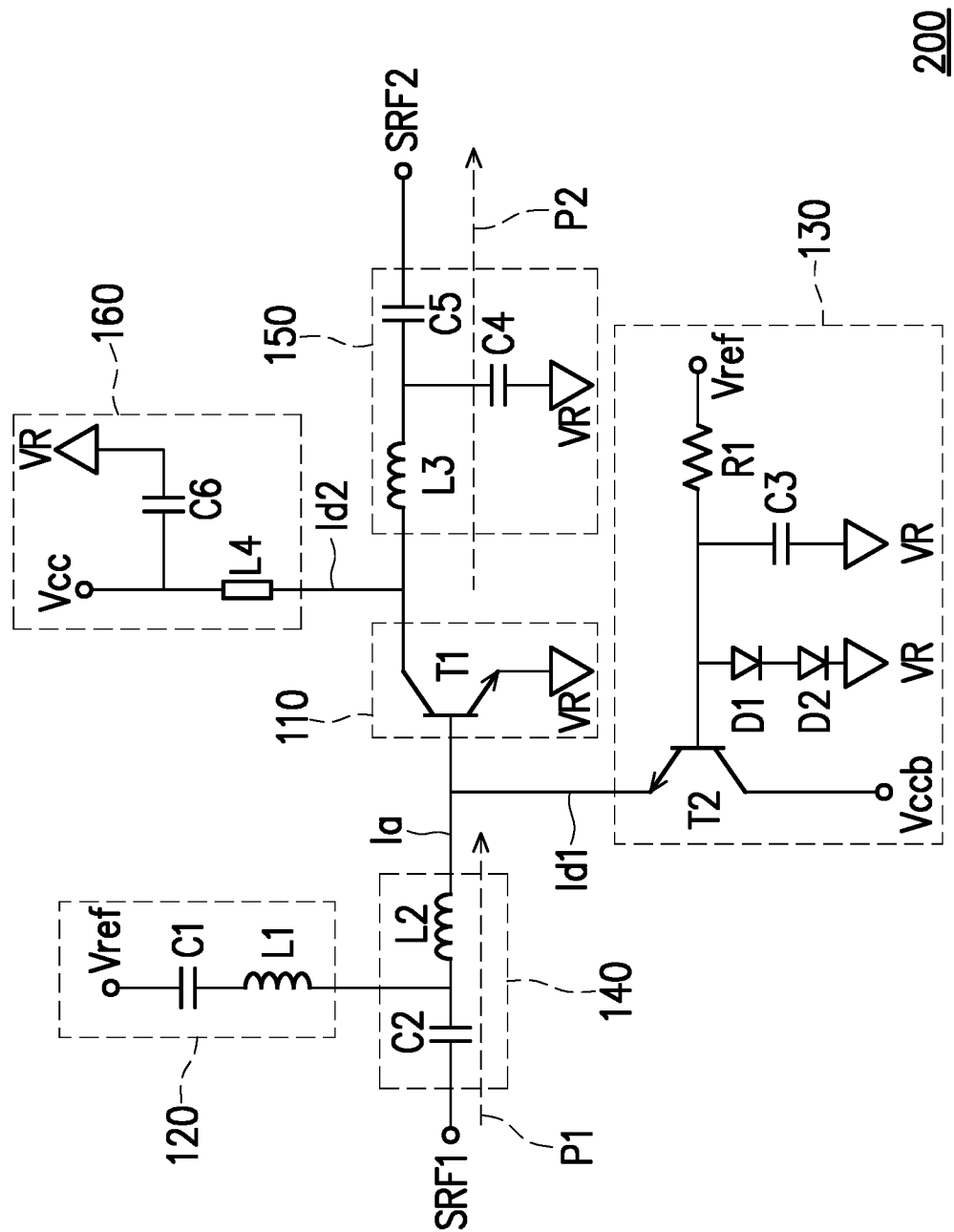
FIG. 3 is a schematic circuit diagram illustrating the RF amplifier shown in FIG. 2 according to an embodiment of the disclosure.

FIG. 3 is a schematic circuit diagram illustrating the RF amplifier 200 shown in FIG. 2 according to an embodiment of the disclosure. According to actual design, the descriptions of the amplifier 110, the inductive-capacitive resonance circuit 120, and the bias circuit 130 shown in FIG. 3 may also be deduced by analogy from the descriptions of the amplifier 110, the inductive-capacitive resonance circuit 120, and the bias circuit 130 shown in FIG. 1. In the embodiment shown in FIG. 3, the RF amplifier 200 includes the amplifier 110, the inductive-capacitive resonance circuit 120, an inductive-capacitive resonance circuit 160, the bias circuit 130, the matching circuit 140, and the matching circuit 150. The amplifier 110 includes a transistor T1. The transistor T1 may be, for instance, an NPN transistor, a BJT transistor, or a MOS transistor, which should not be construed as a limitation in the disclosure. In detail, a control terminal (e.g., the base) of the transistor T1 is coupled to the input terminal of the amplifier 110 to receive the incoming RF signal SRF1. A first terminal of the transistor T1 (e.g., the emitter) is coupled to a reference voltage VR (e.g., the ground voltage or any other fixed voltage). A second terminal of the transistor T1 (e.g., the collector) is coupled to the output terminal of the amplifier 110 to output the amplified RF signal SRF2.

In the embodiment, the inductive-capacitive resonance circuit 120 may include a capacitor C1 and an inductor L1 connected in series, for instance. In the embodiment shown in FIG. 3, A first terminal of the capacitor C1 is coupled to the first terminal of the inductive-capacitive resonance circuit 120 to receive the reference voltage Vref. A second terminal of the capacitor C1 is coupled to a first terminal of the inductor L1. A second terminal of the inductor L1 is coupled to the second terminal of the inductive-capacitive resonance circuit 120 and thus coupled to the matching circuit 140. In other embodiments, locations of the capacitor C1 and the inductor L1 are interchangeable, and the coupling manner is not limited to what is shown in FIG. 3. In some embodiments, the capacitor C1 may be a variable capacitor, so as to adjust a capacitance value of the capacitor C1 according to operating conditions of the RF amplifier 200 (e.g., an operating bandwidth or an operating frequency), whereby the impedance may be adjusted. In addition, the inductive-capacitive resonance circuit 120 may also be implemented with reference to several embodiments provided in the following paragraphs.

In the embodiment, the matching circuit 140 may include a capacitor C2 and an inductor L2. In detail, the capacitor C2 is arranged in the RF path P1. A first terminal of the capacitor C2 is configured to receive the incoming RF signal SRF1. A second terminal of the capacitor C2 is coupled to the second terminal of the inductive-capacitive resonance circuit 120 and the first terminal of the inductor L1. The second terminal of the inductor L1 is coupled to the input terminal of the amplifier 110 to provide an alternating current (AC) component Ia to the input terminal of the amplifier 110. According to design requirements, the capacitor C2 and the inductor L2 may form the RF path P1, and the matching circuit 140 may provide an input impedance matching the amplifier 110. The input impedance provided by the matching circuit 140 may be collectively determined by the capacitor C2 and the inductor L2 in the matching circuit 140 and the capacitor C1 and the inductor L1 in the inductive-capacitive resonance circuit 120. In some embodiments, the inductive-capacitive resonance circuit 120 and the matching circuit 140 may share the inductor L2 to have the first resonant frequency. As a result, an inductance value of the inductor L1 may be reduced, so as to reduce the size of the RF amplifier 200.

In the embodiment, the bias circuit 130 may include a transistor T2, a diode unit, a capacitor C3, and a resistor R1. The transistor T2 may provide a DC component Id1 on the second terminal of the bias circuit 130. The transistor T2 may be, for instance, an NPN transistor, a BJT transistor, or any other type of transistor. According to actual design, the diode unit may, for instance, include diodes D1 and D2 that are serially connected to each other. In detail, a first terminal of the transistor T2 (e.g., the emitter) is coupled to the second terminal of the bias circuit 130 and thus coupled to the input terminal of the amplifier 110. A second terminal of the transistor T2 (e.g., the collector) is coupled to a system voltage Vccb. A control terminal of the transistor T2 (e.g., the base) is coupled to a first terminal of a diode unit (diodes D1 and D2), a first terminal of the capacitor C3, and a first terminal of the resistor R1. A second terminal of the diode unit (the diodes D1 and D2) and a second terminal of the capacitor C3 are respectively coupled to the reference voltage VR. A second terminal of the resistor R1 is coupled to the first terminal of the bias circuit 130 to receive the reference voltage Vref.

In the embodiment, the matching circuit 150 may include an inductor L3, a capacitor C4, and a capacitor C5. In detail, a first terminal of the inductor L3 is coupled to the output terminal of the amplifier 110. A second terminal of the inductor L3 is coupled to a first terminal of the capacitor C4 and a first terminal of the capacitor C5. A second terminal of the capacitor C4 is coupled to the reference voltage VR. A second terminal of the capacitor C5 is configured to provide the amplified RF signal SRF2. According to design requirements, the capacitor C5 and the inductor L3 may form an RF path P2, and when the capacitor C5 and the inductor L3 are combined with the capacitor C4, the matching circuit 150 may provide the Rout matching the amplifier 110.

The inductive-capacitive resonance circuit 160 may include an inductor L4 and a capacitor C6. In detail, a first terminal of the inductor L4 is coupled to the output terminal of the amplifier 110. A second terminal of the inductor L4 is coupled to a system voltage Vcc and a first terminal of the capacitor C6. A second terminal of the capacitor C6 is coupled to the reference voltage VR. In some embodiments, the inductor L4 may be implemented in form of a choke coil, for instance.

Figure 4:
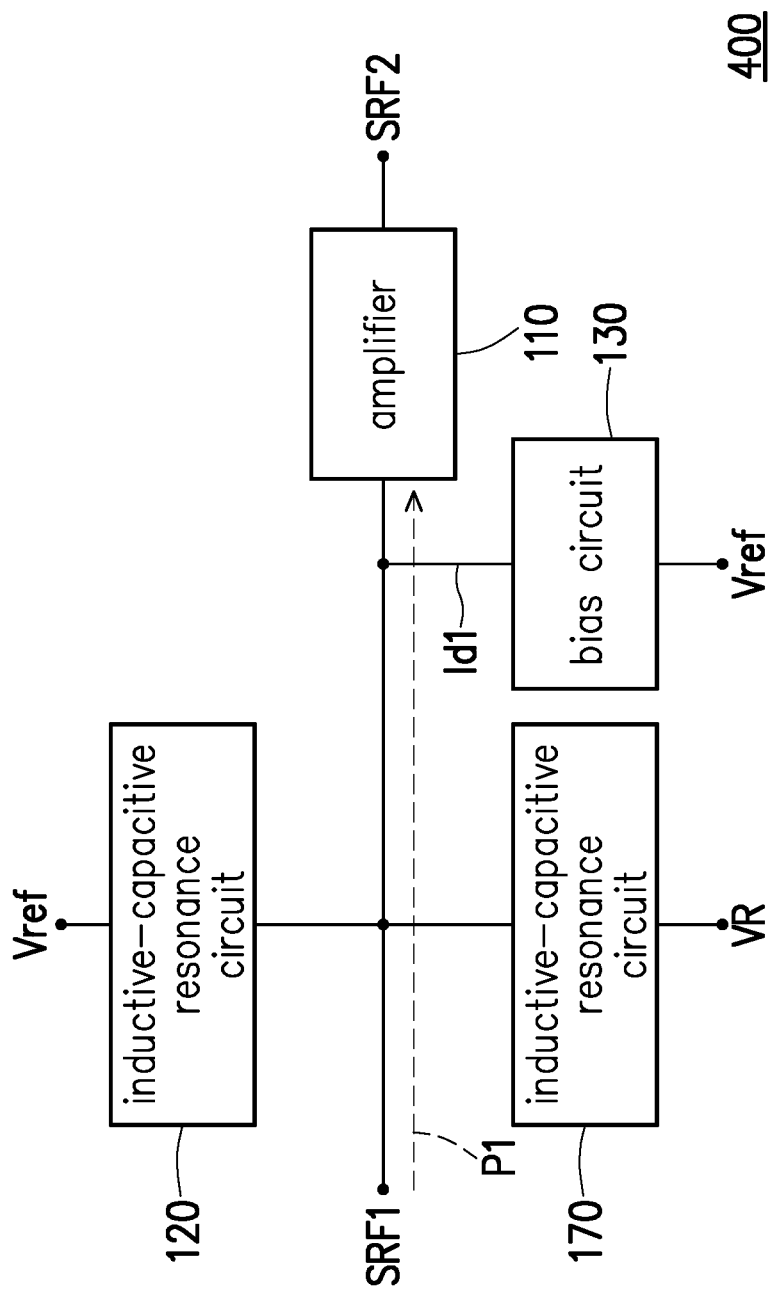
FIG. 4 is a schematic circuit block diagram of an RF amplifier according to yet another embodiment of the disclosure.

FIG. 4 is a schematic circuit block diagram of an RF amplifier 400 according to another embodiment of the disclosure. In the embodiment shown in FIG. 4, the RF amplifier 400 includes the amplifier 110, the inductive-capacitive resonance circuit 120, an inductive-capacitive resonance circuit 170, and the bias circuit 130, all of which are coupled to the RF path P1. According to the actual design, the descriptions of the amplifier 110, the inductive-capacitive resonance circuit 120, and the bias circuit 130 shown in FIG. 4 may be deduced by analogy from the descriptions of the amplifier 110, the inductive-capacitive resonance circuit 120, and the bias circuit 130 shown in FIG. 1 and/or from the descriptions of the amplifier 110, the inductive-capacitive resonance circuit 120, and the bias circuit 130 shown in FIG. 3 and thus will not be repeated hereinafter. In the embodiment shown in FIG. 4, a first terminal of the inductive-capacitive resonance circuit 170 is configured to be coupled to the reference voltage VR (e.g., the ground voltage or any other fixed voltage). According to the actual design, in some embodiments, when the reference voltage Vref is the reference voltage VR (at the second reference level), the RF amplifier 100 is disabled. A second terminal of the inductive-capacitive resonance circuit 170 is configured to be coupled to the second terminal of the inductive-capacitive resonance circuit 120 and coupled to the input terminal of the amplifier 110. As such, when the reference voltage Vref is switched from the second reference level to the first reference level to enable the bias circuit 130, the inductive-capacitive resonance circuit 120 may correspondingly pull up the voltage of the RF path P1 according to variations of the reference voltage Vref; at the same time, the inductive-capacitive resonance circuit 170 may correspondingly pull down the voltage of the RF path P1 according to the reference voltage VR. Therefore, in the initial stage during which the bias circuit 130 is enabled by the reference voltage Vref, the inductive-capacitive resonance circuits 120 and 170 may quickly bring the voltage of the input terminal of the amplifier 110 to be close to the preset target level, so that the amplifier 110 may reach the operation point more quickly.

Figure 5:
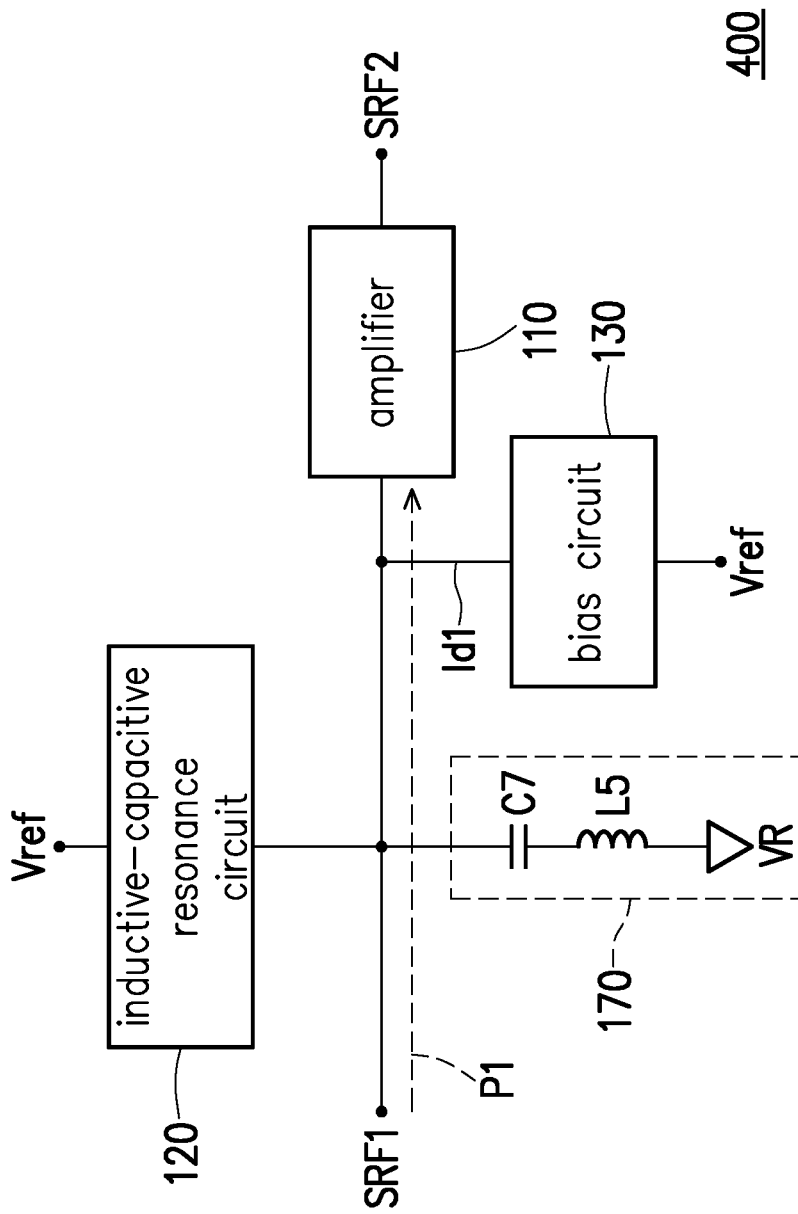
FIG. 5 is a schematic diagram illustrating the inductive-capacitive resonance circuit shown in FIG. 4 according to an embodiment of the disclosure.

FIG. 5 is a schematic diagram illustrating the inductive-capacitive resonance circuit 170 shown in FIG. 4 according to an embodiment of the disclosure. In the embodiment shown in FIG. 5, the inductive-capacitive resonance circuit 170 includes an inductor L5 and a capacitor C7 connected in series. A first terminal of the inductor L5 is coupled to the first terminal of the inductive-capacitive resonance circuit 170 and is coupled to the reference voltage VR. A second terminal of the inductor L5 is coupled to a first terminal of the capacitor C7. A second terminal of the capacitor C7 is coupled to the second terminal of the inductive-capacitive resonance circuit 170 and thus coupled to the RF path P1. In other embodiments, locations of the capacitor C7 and the inductor L5 are interchangeable, and the coupling manner is not limited to what is shown in FIG. 5. For signal components (noise) of the incoming RF signal SRF1 outside the frequency band constituted by the first frequency and the second frequency, the inductive-capacitive resonance circuit 170 may provide a low impedance path to effectively filter out the noise in the incoming RF signal SRF1. For signals with the frequency band within the first frequency and the second frequency in the incoming RF signal SRF1, the inductive-capacitive resonance circuit 170 may provide a high impedance path.

Figure 6:
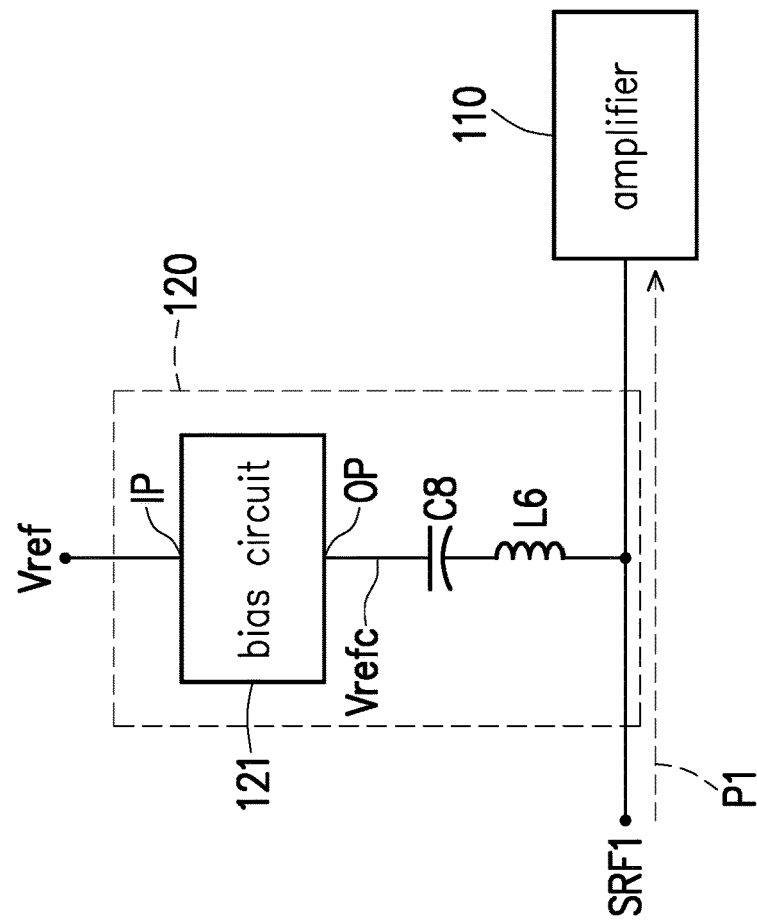
FIG. 6 is a schematic circuit block diagram illustrating the inductive-capacitive resonance circuit shown in FIG. 2 according to another embodiment of the disclosure.

In the foregoing embodiments, the implementation manner of the inductive-capacitive resonance circuit 120 may not be limited to the embodiment shown in FIG. 3. For instance, FIG. 6 is a schematic diagram illustrating the inductive-capacitive resonance circuit 120 shown in FIG. 2 according to another embodiment of the disclosure. According to the actual design, the descriptions of the inductive-capacitive resonance circuit 120 shown in FIG. 6 may also be deduced by analogy from the descriptions of the inductive-capacitive resonance circuit 120 shown in FIG. 1, FIG. 4, and/or FIG. 5. In the embodiment shown in FIG. 6, the inductive-capacitive resonance circuit 120 may include a bias circuit 121, a capacitor C8, and an inductor L6, and the inductive-capacitive resonance circuit 120 has the first terminal and the second terminal that are respectively coupled to the reference voltage Vref and the RF path P1. According to actual design, the bias circuit 121 may include a low Rout bias circuit and/or any other voltage generating circuit. In detail, the bias circuit 121 has an input terminal IP and an output terminal OP. The input terminal IP is configured to be coupled to the first terminal of the inductive-capacitive resonance circuit 120 to receive the reference voltage Vref, and the output terminal OP is configured to generate a corresponding reference voltage Vrefc. The capacitor C8 and the inductor L6 are connected in series between the output terminal OP of the bias circuit 121 and the second terminal of the inductive-capacitive resonance circuit 120. That is, the capacitor C8 and the inductor L6 are connected in series between the bias circuit 121 and the RF path P1.

In the embodiment shown in FIG. 6, a first terminal of the capacitor C8 is coupled to the output terminal OP of the bias circuit 121 to receive the corresponding reference voltage Vrefc. A second terminal of the capacitor C8 is coupled to a first terminal of the inductor L6. A second terminal of the inductor L6 is coupled to the second terminal of the inductive-capacitive resonance circuit 120 and thus coupled to the RF path P1. In other embodiments, locations of the capacitor C8 and the inductor L6 are interchangeable, and the coupling manner is not limited to what is shown in FIG. 6. When the reference voltage Vref is switched from the second reference level to the first reference level to enable the bias circuit 130, the bias circuit 121 may generate the corresponding reference voltage Vrefc according to variations of the reference voltage Vref. As such, the inductive-capacitive resonance circuit 120 may quickly (instantly) pull up the voltage of the RF path P1 through the corresponding reference voltage Vrefc of the bias circuit 121, so that the amplifier 110 may reach the operation point more quickly.

Figure 7:
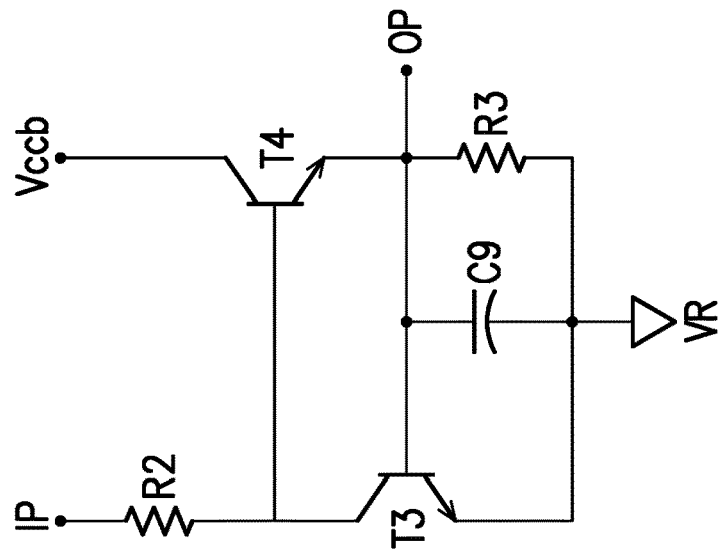
FIG. 7 is a schematic circuit diagram illustrating the bias circuit shown in FIG. 6 according to an embodiment of the disclosure.

FIG. 7 is a schematic circuit diagram illustrating the bias circuit 121 shown in FIG. 6 according to an embodiment of the disclosure. With reference to FIG. 6 and FIG. 7, the bias circuit 121 may include a resistor R2, a transistor T3, and a transistor T4 to form a feedback loop and generate the corresponding low Rout reference voltage Vrefc. In the embodiment shown in FIG. 7, the bias circuit 121 may optionally include a resistor R3 and a capacitor C9 and may serve to reduce oscillation generated by the feedback loop. In detail, a first terminal of the resistor R2 is coupled to the first terminal of the inductive-capacitive resonance circuit 120, i.e., the input terminal IP of the bias circuit 121, so as to receive the reference voltage Vref. A second terminal of the resistor R2 is coupled to a first terminal of the transistor T3 (e.g., the collector) and a control terminal of the transistor T4 (e.g., the base). A control terminal of the transistor T3 (e.g., the base) is coupled to a first terminal of the capacitor C9, a second terminal of the transistor T4 (e.g., the emitter), a first terminal of the resistor R3, and the output terminal OP of the bias circuit 121 to generate the corresponding reference voltage Vrefc. A first terminal of the transistor T4 (e.g., the collector) is coupled to a system voltage Vccb. A second terminal of the transistor T3 (e.g., the emitter), a second terminal of the capacitor C9, and a second terminal of the resistor R3 are respectively coupled to the reference voltage VR (e.g., the ground voltage or any other fixed voltage).

Figure 8:
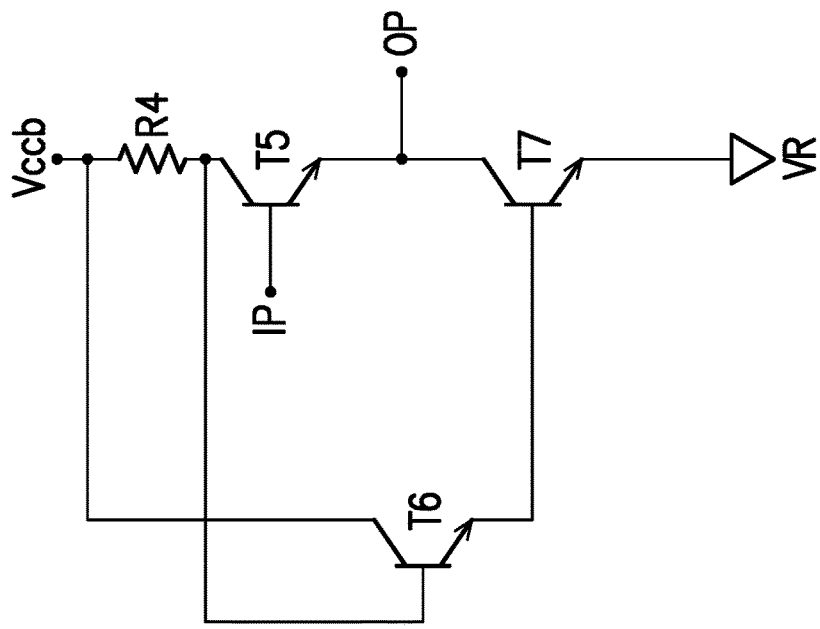
FIG. 8 is a schematic circuit diagram illustrating the bias circuit shown in FIG. 6 according to another embodiment of the disclosure.

FIG. 8 is a schematic circuit diagram illustrating the bias circuit 121 shown in FIG. 6 according to another embodiment of the disclosure. With reference to FIG. 6 and FIG. 8, in the embodiment shown in FIG. 8, the bias circuit 121 may include a resistor R4, a transistor T5, a transistor T6, and a transistor T7 to form a feedback loop and generate the corresponding low Rout reference voltage Vrefc. The transistor T6 and the transistor T7 may also be configured to provide greater gain effects. In detail, a first terminal of the resistor R4 and a first terminal of the transistor T6 (e.g., the collector) are respectively coupled to the system voltage Vccb. A second terminal of the resistor R4 is coupled to a first terminal of the transistor T5 (e.g., the collector) and a control terminal of the transistor T6 (e.g., the base). In the embodiment shown in FIG. 8, a control terminal (e.g., the base) of the transistor T5 is coupled to the first terminal of the inductive-capacitive resonance circuit 120, i.e., the input terminal IP of the bias circuit 121, so as to receive the reference voltage Vref. A second terminal of the transistor T5 (e.g., the emitter) and a first terminal of the transistor T7 (e.g., the collector) are jointly coupled to the output terminal OP of the bias circuit 121 to generate a corresponding reference voltage Vrefc. A control terminal of the transistor T7 (e.g., the base) is coupled to a second terminal of the transistor T6 (e.g., the emitter). A second terminal of the transistor T7 (e.g., the emitter) is coupled to the reference voltage VR (e.g., the ground voltage or any other fixed voltage).

Figure 9:
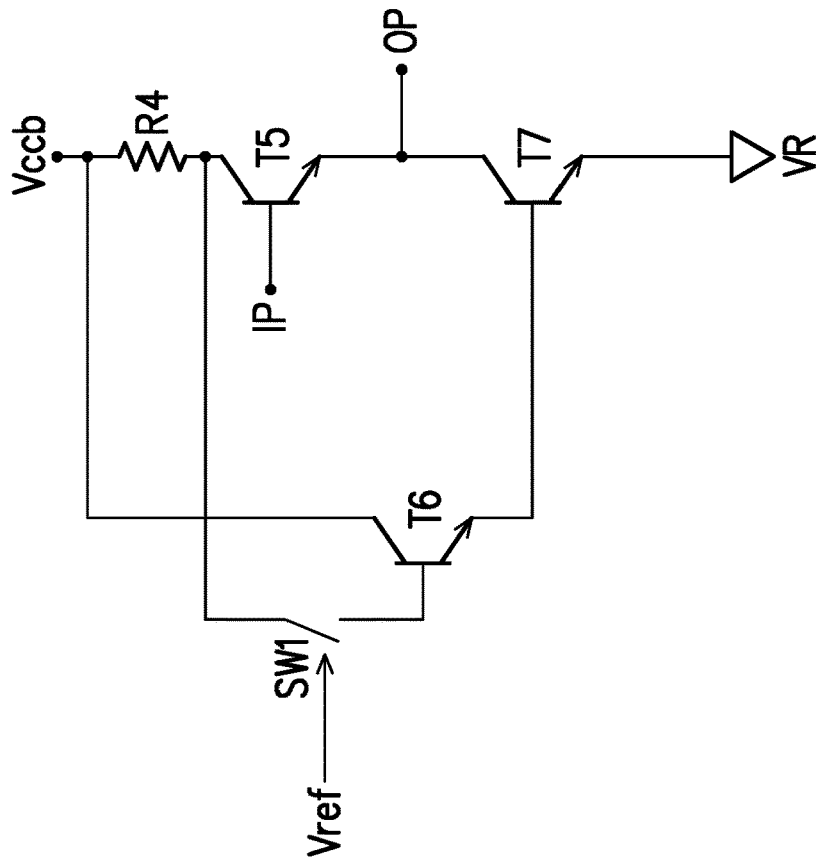
FIG. 9 is a schematic circuit diagram illustrating the bias circuit shown in FIG. 6 according to yet another embodiment of the disclosure.

FIG. 9 is a schematic circuit diagram illustrating the bias circuit 121 shown in FIG. 6 according to yet another embodiment of the disclosure. With reference to FIG. 6 and FIG. 9, in the embodiment shown in FIG. 9, the bias circuit 121 may include a switch circuit SW1, the resistor R4, the transistor T5, the transistor T6, and the transistor T7. The descriptions of the resistor R4, the transistor T5, the transistor T6, and the transistor T7 shown in FIG. 9 may be deduced by analogy from the descriptions of the resistor R4, the transistor T5, the transistor T6, and the transistor T7 shown in FIG. 8 and thus will not be repeated hereinafter. The difference from the embodiment shown in FIG. 8 and the embodiment shown in FIG. 9 lies in that the bias circuit 121 shown in FIG. 9 further includes the switch circuit SW1. The switch circuit SW1 is coupled between the second terminal of the resistor R4 and the control terminal of the transistor T6. That is, the control terminal of the transistor T6 is coupled to the second terminal of the resistor R4 through the switch circuit SW1. The switch circuit SW1 is controlled by the reference voltage Vref. When the reference voltage Vref is at the first reference level, the switch circuit SW1 is turned on, and the RF amplifier 100 is enabled for normal operation. When the reference voltage Vref is at the second reference level (different from the first reference level), the switch circuit SW1 is turned off, and the RF amplifier 100 is disabled to reduce power consumption.

Figure 10:
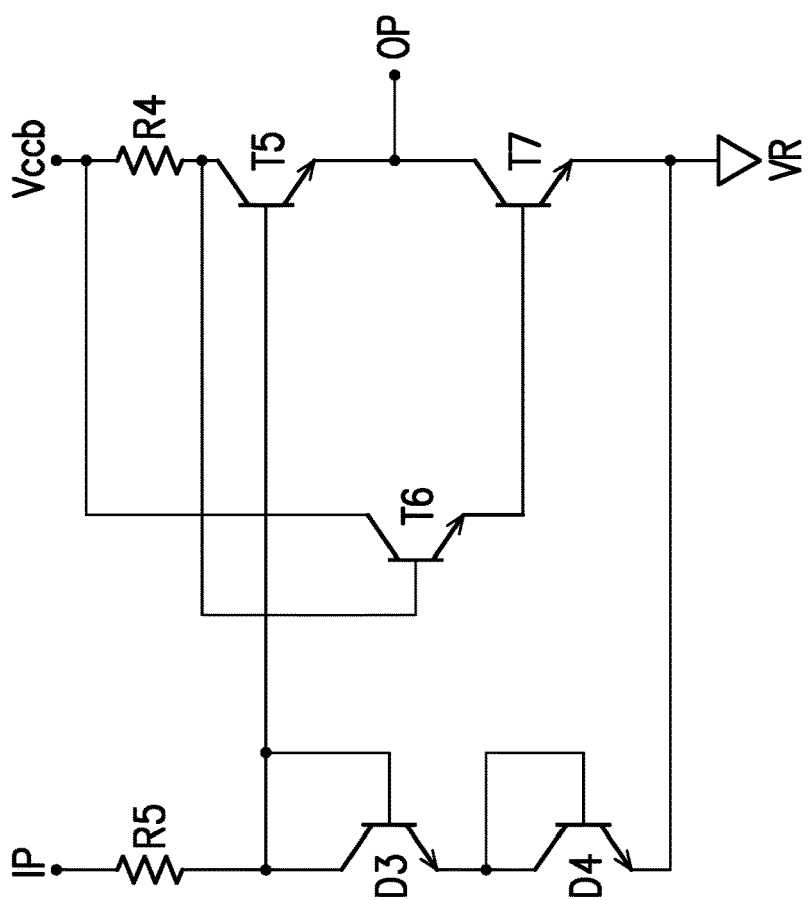
FIG. 10 is a schematic circuit diagram illustrating the bias circuit shown in FIG. 6 according to still another embodiment of the disclosure.

FIG. 10 is a schematic circuit diagram illustrating the bias circuit 121 shown in FIG. 6 according to still another embodiment of the disclosure. With reference to FIG. 8 and FIG. 10, in the embodiment shown in FIG. 10, the bias circuit 121 includes the resistor R4, the transistor T5, the transistor T6, the transistor T7, a resistor R5, and a diode unit. The descriptions of the resistor R4, the transistor T5, the transistor T6, and the transistor T7 shown in FIG. 10 may be deduced by analogy from the descriptions of the resistor R4, the transistor T5, the transistor T6, and the transistor T7 shown in FIG. 8 and thus will not be repeated hereinafter. The difference between the embodiment shown in FIG. 8 and the embodiment shown in FIG. 10 lies in that the control terminal of the transistor T5 shown in FIG. 10 is coupled to the input terminal IP of the bias circuit 121 through the resistor R5.

According to the actual design, in the embodiment shown in FIG. 10, the diode unit includes diodes D3 and D4 that are serially connected to each other, wherein the serially connected diodes D3 and D4 are transistors. The resistor R5 and the diodes D3 and D4 may generate appropriate voltages to drive the bias circuit 121. In detail, a first terminal of the resistor R5 is coupled to the first terminal of the inductive-capacitive resonance circuit 120, i.e., the input terminal IP of the bias circuit 121, so as to receive the reference voltage Vref. A second terminal of the resistor R5 is coupled to the control terminal of the transistor T5 and a first terminal of the diode unit (an anode of the diode D3). A second terminal of the diode unit (a cathode of the diode D4) is coupled to the reference voltage VR.

Figure 11:
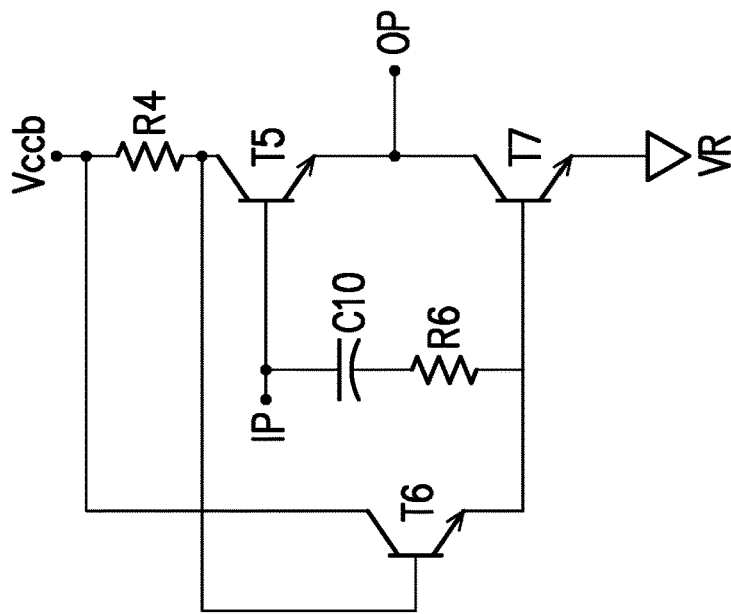
FIG. 11 is a schematic circuit diagram illustrating the bias circuit shown in FIG. 6 according to still another embodiment of the disclosure.

FIG. 11 is a schematic circuit diagram illustrating the bias circuit 121 shown in FIG. 6 according to still another embodiment of the disclosure. With reference to FIG. 8 and FIG. 11, in the embodiment shown in FIG. 11, the bias circuit 121 includes the resistor R4, the transistor T5, the transistor T6, the transistor T7, a capacitor C10, and a resistor R6. The descriptions of the resistor R4, the transistor T5, the transistor T6, and the transistor T7 shown in FIG. 11 may be deduced by analogy from the descriptions of the resistor R4, the transistor T5, the transistor T6, and the transistor T7 shown in FIG. 8 and thus should not be repeated hereinafter. The difference between the embodiment shown in FIG. 8 and the embodiment shown in FIG. 11 lies in that the bias circuit 121 shown in FIG. 11 further includes the capacitor C10 and the resistor R6 connected in series with each other. The resistor R6 and the capacitor C10 may serve to reduce the oscillation generated by the feedback loop. In detail, a first terminal of the capacitor C10 is coupled to the control terminal of the transistor T5. A second terminal of the capacitor C10 is coupled to a first terminal of the resistor R6. A second terminal of the resistor R6 is coupled to the control terminal of the transistor T7. In other embodiments, locations of the capacitor C10 and the resistor R6 are interchangeable, and the coupling manner is not limited to what is shown in FIG. 11.

To sum up, the RF amplifier described in one or more embodiments of the disclosure may provide the DC component to the input terminal of the amplifier through the bias circuit 130. The inductive-capacitive resonance circuit 120 may provide the filter path. In addition, the reference voltage Vref may be switched between different reference levels to enable and disable the RF amplifier. When the bias circuit 130 is enabled by the reference voltage Vref, the inductive-capacitive resonance circuit 120 may correspondingly pull up the voltage of the RF path P1 according to variations of the reference voltage Vref, so that the amplifier 110 may reach the operation point more quickly.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A radio frequency amplifier, comprising:
    an amplifier, comprising an input terminal configured to receive an incoming radio frequency signal through a first radio frequency path;
    a first inductive-capacitive resonance circuit, comprising a first terminal configured to be coupled to a first reference voltage, wherein a second terminal of the first inductive-capacitive resonance circuit is coupled to the first radio frequency path, and wherein in response to the first reference voltage being at a first reference level, the radio frequency amplifier is enabled, and in response to the first reference voltage being at a second reference level, the radio frequency amplifier is disabled; and
    a first bias circuit, comprising a first terminal configured to be coupled to the first reference voltage, wherein a second terminal of the first bias circuit is directly coupled to the input terminal of the amplifier to provide a first direct current component.

2. The radio frequency amplifier according to claim 1, further comprising:
    a second inductive-capacitive resonance circuit, comprising a first terminal configured to be coupled to a second reference voltage, wherein a second terminal of the second inductive-capacitive resonance circuit is coupled to the second terminal of the first inductive-capacitive resonance circuit.

3. The radio frequency amplifier according to claim 2, wherein the second reference voltage is at the second reference level.

4. The radio frequency amplifier according to claim 2, wherein the second inductive-capacitive resonance circuit comprises an inductor and a capacitor connected in series.

5. The radio frequency amplifier according to claim 4, wherein:
    a first terminal of the inductor is coupled to the first terminal of the second inductive-capacitive resonance circuit, and
    a first terminal of the capacitor is coupled to a second terminal of the inductor, wherein a second terminal of the capacitor is coupled to the second terminal of the second inductive-capacitive resonance circuit.

6. The radio frequency amplifier according to claim 1, wherein the first inductive-capacitive resonance circuit comprises a second inductor and a capacitor connected in series.

7. The radio frequency amplifier according to claim 6, wherein:
    a first terminal of the capacitor is coupled to the first terminal of the first inductive-capacitive resonance circuit, and
    a first terminal of the second inductor is coupled to a second terminal of the capacitor, wherein a second terminal of the second inductor is coupled to the second terminal of the first inductive-capacitive resonance circuit.

8. The radio frequency amplifier according to claim 1, wherein the first inductive-capacitive resonance circuit comprises:
    a second bias circuit, coupled to the first terminal of the first inductive-capacitive resonance circuit to receive the first reference voltage and configured to generate a corresponding reference voltage; and
    a first capacitor and an inductor, connected in series between an output terminal of the second bias circuit and the second terminal of the first inductive-capacitive resonance circuit.

9. The radio frequency amplifier according to claim 8, wherein:
    a first terminal of the first capacitor is coupled to the output terminal of the second bias circuit to receive the corresponding reference voltage, and
    a first terminal of the inductor is coupled to a second terminal of the first capacitor, wherein a second terminal of the inductor is coupled to the second terminal of the first inductive-capacitive resonance circuit.

10. The radio frequency amplifier according to claim 8, wherein the second bias circuit comprises:
    a first resistor, wherein a first terminal of the first resistor is coupled to the first terminal of the first inductive-capacitive resonance circuit to receive the first reference voltage;
    a first transistor, wherein a first terminal of the first transistor is coupled to a second terminal of the first resistor, and a second terminal of the first transistor is coupled to a second reference voltage; and
    a second transistor, wherein a first terminal of the second transistor is coupled to a system voltage, a second terminal of the second transistor is coupled to the output terminal of the second bias circuit and a control terminal of the first transistor, and a control terminal of the second transistor is coupled to the second terminal of the first resistor.

11. The radio frequency amplifier according to claim 10, wherein the second bias circuit further comprises:
    a second capacitor, wherein a first terminal of the second capacitor is coupled to the control terminal of the first transistor, and a second terminal of the second capacitor is coupled to the second reference voltage.

12. The radio frequency amplifier according to claim 8, wherein the second bias circuit comprises:
    a first resistor, a first terminal of the first resistor being coupled to a system voltage;
    a first transistor, wherein a first terminal of the first transistor is coupled to a second terminal of the first resistor, and a second terminal of the first transistor is coupled to the output terminal of the second bias circuit;
    a second transistor, wherein a first terminal of the second transistor is coupled to the system voltage, and a control terminal of the second transistor is coupled to the second terminal of the first resistor; and
    a third transistor, wherein a first terminal of the third transistor is coupled to the second terminal of the first transistor, a second terminal of the third transistor is coupled to a second reference voltage, and a control terminal of the third transistor is coupled to a second terminal of the second transistor.

13. The radio frequency amplifier according to claim 12, wherein the second bias circuit further comprises:
a switch circuit, coupled between the second terminal of the first resistor and the control terminal of the second transistor, wherein the switch circuit is controlled by the first reference voltage, and the control terminal of the second transistor is coupled to the second terminal of the first resistor through the switch circuit.

14. The radio frequency amplifier according to claim 12, wherein a control terminal of the first transistor is coupled to the first terminal of the first inductive-capacitive resonance circuit to receive the first reference voltage.

15. The radio frequency amplifier according to claim 12, wherein the second bias circuit further comprises:
a second resistor, wherein a first terminal of the second resistor is coupled to the first terminal of the first inductive-capacitive resonance circuit to receive the first reference voltage, and a second terminal of the second resistor is coupled to a control terminal of the first transistor; and
a diode unit, wherein a first terminal of the diode unit is coupled to the second terminal of the second resistor, and a second terminal of the diode unit is coupled to the second reference voltage.

16. The radio frequency amplifier according to claim 12, wherein the second bias circuit further comprises a second capacitor and a second resistor connected in series.

17. The radio frequency amplifier according to claim 16, wherein:
a first terminal of the second capacitor is coupled to a control terminal of the first transistor,
a first terminal of the second resistor is coupled to a second terminal of the second capacitor, and a second terminal of the second resistor is coupled to the control terminal of the third transistor.

18. The radio frequency amplifier according to claim 1, wherein the first inductive-capacitive resonance circuit comprises a bias circuit, and the bias circuit of the first inductive-capacitive resonance circuit comprises:
a first resistor, a first terminal of the first resistor being coupled to a system voltage;
a first transistor, wherein a first terminal of the first transistor is coupled to a second terminal of the first resistor, and a second terminal of the first transistor is coupled to an output terminal of the bias circuit;
a second transistor, wherein a first terminal of the second transistor is coupled to the system voltage, and a control terminal of the second transistor is coupled to the second terminal of the first resistor; and
a third transistor, wherein a first terminal of the third transistor is coupled to the second terminal of the first transistor, a second terminal of the third transistor is coupled to a reference voltage, and a control terminal of the third transistor is coupled to a second terminal of the second transistor.

19. A radio frequency amplifier, comprising:
an amplifier, comprising an input terminal configured to receive an incoming radio frequency signal through a first radio frequency path;
a first inductive-capacitive resonance circuit, comprising a first terminal configured to be coupled to a first reference voltage, wherein a second terminal of the first inductive-capacitive resonance circuit is coupled to the first radio frequency path, and wherein in response to the first reference voltage being at a first reference level, the radio frequency amplifier is enabled, and in response to the first reference voltage being at a second reference level, the radio frequency amplifier is disabled;
a second inductive-capacitive resonance circuit, comprising a first terminal configured to be coupled to a second reference voltage, wherein a second terminal of the second inductive-capacitive resonance circuit is coupled to the second terminal of the first inductive-capacitive resonance circuit; and
a first bias circuit, comprising a first terminal configured to be coupled to the first reference voltage, wherein a second terminal of the first bias circuit is coupled to the input terminal of the amplifier to provide a first direct current component.

20. A radio frequency amplifier, comprising:
an amplifier, comprising an input terminal configured to receive an incoming radio frequency signal through a first radio frequency path;
a first inductive-capacitive resonance circuit, comprising a first terminal configured to be coupled to a first reference voltage, wherein a second terminal of the first inductive-capacitive resonance circuit is coupled to the first radio frequency path, and wherein in response to the first reference voltage being at a first reference level, the radio frequency amplifier is enabled, and in response to the first reference voltage being at a second reference level, the radio frequency amplifier is disabled; and
a first bias circuit, comprising a first terminal configured to be coupled to the first reference voltage, wherein a second terminal of the first bias circuit is coupled to the input terminal of the amplifier to provide a first direct current component,
wherein the first inductive-capacitive resonance circuit and the first bias circuit are coupled in parallel between the first radio frequency path and the first reference voltage.

* * * * *